US012575326B2

(12) United States Patent
Tayeb et al.

(10) Patent No.: US 12,575,326 B2
(45) Date of Patent: Mar. 10, 2026

(54) PIEZOELECTRIC TEXTILES PRODUCED VIA ELECTROSPINNING

(71) Applicant: SABIC Global Technologies B.V., Bergen op Zoom (NL)

(72) Inventors: Mohammed Abdulwahab Tayeb, Geleen (NL); Taghreed A. Jalal, Geleen (NL); Karina Katarzyna Kopec, Geleen (NL)

(73) Assignee: SABIC Global Technologies B.V., Bergen op Zoom (NL)

( * ) Notice: Subject to any disclaimer, the term of this patent is extended or adjusted under 35 U.S.C. 154(b) by 317 days.

(21) Appl. No.: 18/262,473

(22) PCT Filed: Jan. 21, 2022

(86) PCT No.: PCT/EP2022/051303
§ 371 (c)(1),
(2) Date: Jul. 21, 2023

(87) PCT Pub. No.: WO2022/157284
PCT Pub. Date: Jul. 28, 2022

(65) Prior Publication Data
US 2024/0081152 A1     Mar. 7, 2024

(30) Foreign Application Priority Data
Jan. 25, 2021    (EP) .................................... 21153143

(51) Int. Cl.
*D01D 7/00*      (2006.01)
*D01D 5/00*      (2006.01)
(Continued)

(52) U.S. Cl.
CPC ......... *H10N 30/702* (2024.05); *D01D 5/0038* (2013.01); *D01F 1/10* (2013.01);
(Continued)

(58) Field of Classification Search
CPC ............ B29K 2023/08; B29K 2023/14; B29K 2105/002; B29K 2427/16; B29K 2509/02;
(Continued)

(56) References Cited

U.S. PATENT DOCUMENTS 6,162,535 A    12/2000   Turkevich et al.
2010/0056007 A1    3/2010   Rabolt et al.
(Continued)

FOREIGN PATENT DOCUMENTS

CN      102242464 A    11/2011
JP      2011233817 A    11/2011
(Continued)

OTHER PUBLICATIONS

Parangusan et. al. "Stretchable Electrospun PVDF-HFP/Co-ZnO Nanofibers as Piezoelectric Nanogenerators", Scientific Reports, vol. 8, Jan. 15, 2018, pp. 1-11.
(Continued)

*Primary Examiner* — Leo B Tentoni
(74) *Attorney, Agent, or Firm* — Fish & Richardson P.C.

(57) ABSTRACT

A piezoelectric fabric can include: a non-woven, continuous fiber mat comprising: a polymer; and a plurality of piezoelectric ceramic particles. The piezoelectric fabric can be produced by electrospinning. The method of electrospinning can include: forming a continuous fiber of material comprising: flowing a fluid through a needle, wherein the fluid comprises: the polymer; a base fluid; and the piezoelectric ceramic particles; and applying a voltage to create an electric field between a tip of the needle and a collector during fluid flow; and collecting the continuous fiber on the collector. The piezoelectric fabric can exhibit improved performance and piezo thermal stability.

10 Claims, 1 Drawing Sheet

(51) Int. Cl.

| | | |
|---|---|---|
| *D01F 1/10* | (2006.01) | |
| *D01F 6/30* | (2006.01) | |
| *D04H 1/728* | (2012.01) | |
| *D04H 3/007* | (2012.01) | |
| *D04H 3/03* | (2012.01) | |
| *D04H 3/16* | (2006.01) | |
| *H10N 30/00* | (2023.01) | |
| *H10N 30/092* | (2023.01) | |
| *H10N 30/30* | (2023.01) | |
| *H10N 30/85* | (2023.01) | |
| *B29K 23/00* | (2006.01) | |
| *B29K 105/00* | (2006.01) | |
| *B29K 427/12* | (2006.01) | |
| *B29K 509/02* | (2006.01) | |

(52) U.S. Cl.

CPC ............... *D01F 6/30* (2013.01); *D04H 1/728* (2013.01); *D04H 3/007* (2013.01); *D04H 3/03* (2013.01); *D04H 3/16* (2013.01); *H10N 30/092* (2023.02); *H10N 30/302* (2023.02); *H10N 30/852* (2023.02); *B29K 2023/08* (2013.01); *B29K 2023/14* (2013.01); *B29K 2105/002* (2013.01); *B29K 2427/16* (2013.01); *B29K 2509/02* (2013.01); *D10B 2321/02* (2013.01); *D10B 2321/021* (2013.01); *D10B 2321/022* (2013.01); *D10B 2401/00* (2013.01)

(58) Field of Classification Search

CPC .......... D01D 5/0038; D01D 7/00; D01F 6/30; D04H 3/007; D10B 2321/02; D10B 2321/021; D10B 2321/022; H10N 30/084; H10N 30/092

USPC ....... 264/103, 104, 211, 211.12, 331.17, 465

See application file for complete search history.

(56) References Cited

U.S. PATENT DOCUMENTS

| | | | |
|---|---|---|---|
| 2010/0233458 A1 * | 9/2010 | Sun | D01F 8/14 |
| | | | 428/401 |
| 2016/0190427 A1 | 6/2016 | Kim et al. | |
| 2019/0229255 A1 * | 7/2019 | Yasuda | H10N 30/092 |
| 2022/0416152 A1 * | 12/2022 | Umebayashi | D01D 5/0038 |

FOREIGN PATENT DOCUMENTS

| | | | |
|---|---|---|---|
| WO | 199744509 A1 | 11/1997 | |
| WO | 2015084951 A1 | 6/2015 | |
| WO | 3199673 A1 | 8/2017 | |
| WO | 2019201353 A1 | 10/2019 | |
| WO | 2020022916 A1 | 1/2020 | |
| WO | 2020136420 A1 | 7/2020 | |
| WO | WO-2021024833 A1 * | 2/2021 | .......... D01D 5/0038 |

OTHER PUBLICATIONS

Shao et. al. "Effect of electrospinning parameters and polymer concentrations on mechanical-to-electrical energy conversion of randomly-oriented electrospun poly (vinylidene fluoride) nanofiber mats", RSC advances, vol. 5, Jan. 22, 2015, pp. 14345-14350.

Lee et. al., "Electrospun uniaxially-aligned composite nanofibers as highly-efficient piezoelectric material", Ceramics International, vol. 42, Nov. 10, 2015, pp. 2734-2740.

Esfahani et. al. "Electrospun ceramic nanofiber mats today: Synthesis, properties, and applications", Materials, vol. 10, Oct. 27, 2017, pp. 1-42.

Xin et. al. "A brief review on piezoelectric PVDF nanofibers prepared by electrospinning", Ferroelectrics, vol. 526, pp. 140-151.

Saha et. al. "Synthesis and Characterization of Polyvinylidene-fluoride (PVDF) Nanofiber for Application as Piezoelectric Force Sensor", Materials Today: Proceedings, vol. 18, Aug. 31, 2019, pp. 1450-1458.

Hussein et al. "Effect of Adding BaTiO3 to PVDF as Nano Generator", Journal of Physics: Conference Series, vol. 1294, Oct. 25, 2019, pp. 1-10.

Samadi et al. "Influence of TiO2—Fe3O4—MWCNT hybrid nanotubes on piezoelectric and electromagnetic wave absorption properties of electrospun PVDF nanocomposites", Organic Electronics, vol. 75, Aug. 14, 2019, pp. 1-8.

Xue et al. "Electrospinning and electrospun nanofibers: Methods, materials, and applications", Chemical Reviews, vol. 119, Mar. 27, 2019, pp. 5298-5415.

Gugulothu et al. "Fabrication of Nanofibers: Electrospinning and Non-Electrospinning Techniques. Handbook of Nanofibers", Aug. 22, 2018, pp. 1-34.

Zha et al. "Electrospinning Functional Fillers/Polymer Composites With High Energy Storage", Dielectric Polymer Materials for High-Density Energy Storage: Plastics Design Library, Jun. 15, 2018, pp. 289-321.

Pierini et al. "Electrospun Polyaniline-Based Composite Nanofibers: Tuning the Electrical Conductivity by Tailoring the Structure of Thiol-Protected Metal Nanoparticles", Journal of Nanomaterials, vol. 2017, Sep. 7, 2017, pp. 1-10.

Foreign communication from related application—International Search Report and Written for application No. PCT/EP2022/051303 filed on Jan. 21, 2022, 14 pages.

CN office action issued on Jun. 24, 2025 for the patent Application No. 202280009168.1, 12 pages.

* cited by examiner

PIEZOELECTRIC TEXTILES PRODUCED VIA ELECTROSPINNING

CROSS REFERENCE TO RELATED APPLICATIONS

This application is a National Stage Application under 35 U.S.C. § 371 and claims the benefit of International Application No. PCT/EP2022/051303, filed Jan. 21, 2022, which claims priority to and the benefit of the filing date of EP 21153143.9, filed Jan. 25, 2021, which is incorporated herein by reference in its entirety.

TECHNICAL FIELD

Piezocomposite materials can be used to produce electronic textiles. The piezocomposite materials can be formed into continuous fibers that can form a fabric via electrospinning.

BRIEF DESCRIPTION OF THE FIGURES

The features and advantages of certain embodiments will be more readily appreciated when considered in conjunction with the accompanying figures. The figures are not to be construed as limiting any of the preferred embodiments.

DETAILED DESCRIPTION

Figure 1:
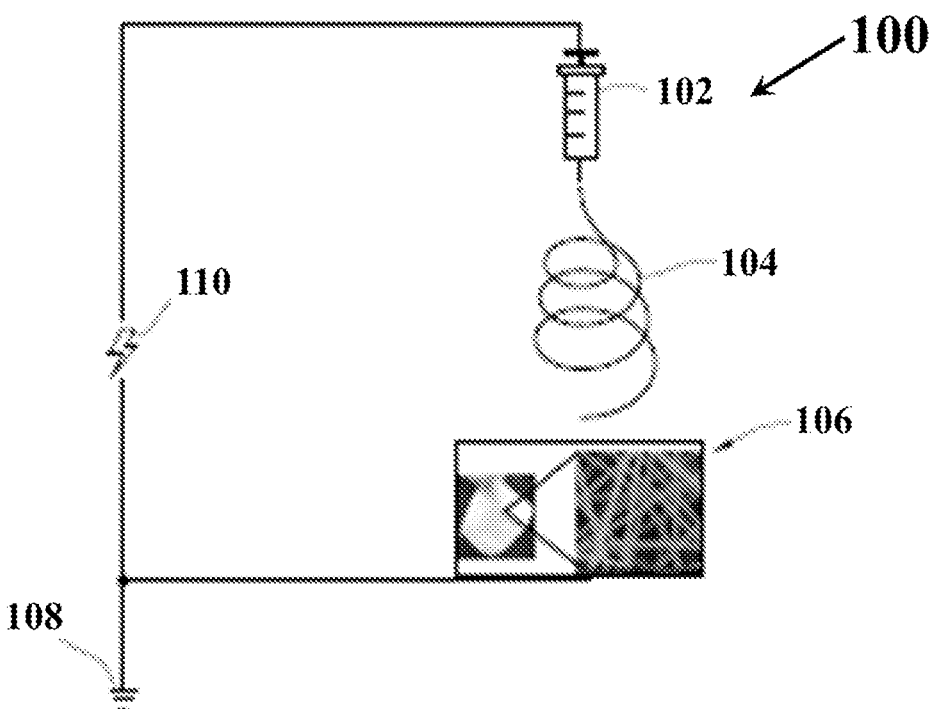
FIG. 1 is a schematic illustration of an electrospinning process.

An electronic textile, commonly called an E-textile, is a type of fabric that contains electronic elements and can be utilized beyond its main intended use as a fabric or clothing. This multi-functional approach has been derived by numerous researchers and led to scientific advancements worldwide. Among different potential applications are wearable computing, garment design, health care, data storage, and interior design technologies incorporating electronic components, such as microcontrollers, sensors, and actuators into fabrics or fibers.

There has been partial, practical success in embedding electrical components within some fibers. Well-known materials for smart fabrics include traditional cotton, polyester, and nylon, to advanced Kevlar with integrated functionalities. At present, however, resistive/conductive fabrics are made by deposition/mixing of metal nanoparticles or semiconductors around or within the woven fibers and fabrics. The performance of these fabrics tends to suffer from output instability over time or due to environmental effects; and thus, these fabrics are not suitable for long-term performance.

Recently, new developments have been reported for piezoelectric textile fibers with the aim of integrating sensing and energy-harvesting capabilities into smart textile structures and materials. In order to obtain useful textile polymer materials, the polymer goes through one of several spinning processes such as dry spinning, melt spinning, or electrospinning—the transformation (ordering) of the material into yarn. In general, these methods consist of transformation of a polymer solution produced from raw materials (direct spinning) or from dissolving/melting the polymer resin (melt spinning and electrospinning).

In order to enable a piezo material's functionality, poling, which is applying a strong electric field to align the electric dipole moments, is required. Poling is a process that is carried out after the film/disk is made from solid piezo ceramics, such as lead zirconate titanate (PZT) and barium titanate (BT), polymers with beta phase such as polyvinylidene fluoride (PVDF) and poly[(vinylidenefluoride-co-trifluoroethylene] (PVDF-TrFE), or composite systems.

Piezoelectric textiles face several challenges including difficulty in orienting and maintaining the dipole moments—polarization, especially with freely twisting and turning fibers. Another challenge is the efficacy of the fibers for actual applications, for example sensing and energy harvesting. Another current challenge facing the broader adoption of electronic textiles is the need to obtain a combination of high output performance, functionalization, and wearing comfort. Moreover, fibers made of PVDF and PVDF-TrFE are known to decay at higher temperatures, which causes the fibers to lose their polarization and piezo behavior.

Thus, there is a need and ongoing industry wide concern for smart e-textiles that will perform additional objectives besides being a fabric, solve the challenges currently being faced, and work towards a world with "intelligent" garments.

It has been discovered that a new class of piezoelectric materials can be produced via electrospinning by incorporating an olefin copolymer and a piezoelectric ceramic. Some of the advantages of this new class of piezoelectric materials is the fibers are naturally poled during the spinning process and the fabric material has exceptional performance as a piezoelectric sensor and is thermally stable.

According to certain embodiments, a piezoelectric fabric comprises: a non-woven, continuous fiber mat comprising: an olefin copolymer; and piezoelectric ceramics.

According to certain other embodiments, a method of producing a piezoelectric fabric comprises: forming a continuous fiber of material comprising: flowing a fluid through a needle, wherein the fluid comprises: an olefin copolymer; a base fluid; and piezoelectric ceramic particles; applying a voltage to create an electric field between a tip of the needle and a collector during fluid flow; and collecting the continuous fiber on the collector.

It is to be understood that the discussion of any of the embodiments regarding the fibers, fabric, or any materials making up the fibers or fabric is intended to apply to all of the method and composition embodiments without the need to repeat the various embodiments throughout.

The continuous fiber mat can be non-woven. The fiber mat can be formed via electrospinning. FIG. 1 shows an example schematic of an electrospinning process. An electrospinning apparatus 100 generally includes a spinneret 102 (a hypodermic syringe with a needle) connected to a high-voltage (e.g., 0.5 to 30 kilovolts "kV") direct current power supply 110, a syringe pump (not shown), and a collector 106 that is grounded to a ground 108. A polymer solution is loaded into the syringe and extruded from the needle tip at a constant rate by the syringe pump. When a sufficiently high voltage is applied to the liquid droplet, the liquid becomes charged. When the electrostatic repulsion counteracts the surface tension, the droplet is stretched. At a critical point a stream of liquid bursts from the surface of the needle tip. If the molecular cohesion of the liquid is sufficiently high, the stream does not break up and a charged liquid jet is formed and flows from the needle tip. As the jet dries in air, the mode of current flow changes from ohmic to convective as the charge migrates to the surface of the formed fiber 104. The jet is then elongated by electrostatic repulsion, until it is deposited, as shown, on the grounded collector 106. The elongation and thinning of the fiber can lead to the formation of uniform fibers with diameters in the micro- to nano-meter range.

There are several parameters in the electrospinning process that can affect the final morphology of fibers produced—including whether a continuous fiber is formed versus fiber segments. Some of the parameters can be interrelated. The parameters can include, but are not limited to: the molecular weight and molecular weight distribution of the polymer; the properties of the polymer solution, such as concentration, viscosity, conductivity, and surface tension; the applied voltage; flow rate; the distance between the needle tip and the collector; processing conditions, such as temperature and humidity; and needle diameter.

The methods can include flowing a fluid through a needle. The flow rate can be adjusted to form a continuous fiber. The flow rate selected may be dependent on the viscosity of the fluid, among other parameters. By way of example, the flow rate may be related to the viscosity of the fluid. Accordingly, as the viscosity is increased, the flow rate may need to be increased; and as the viscosity is decreased, the flow rate may need to be decreased. According to any of the embodiments, the flow rate is selected such that a continuous fiber is produced. The flow rate according to any of the embodiments can range from 0.1 to 20 milliliters per hour (mL/hr). The flow rate may be different in industrial applications.

The gauge (i.e., the outer diameter) of the needle can vary and can also be selected such that a continuous fiber is produced. The needle gauge can also be related to the flow rate and viscosity of the fluid. Accordingly, the needle gauge for any of the embodiments can be selected based on the viscosity and flow rate, inter alia, to produce a continuous fiber. By way of example, the needle can range from 18 to 15 gauge. The needle can also have a blunt tip.

The fluid that is flowed through the needle can include a polymer. A polymer is a molecule composed of repeating units, typically connected by covalent chemical bonds. A polymer is formed from monomers. During the formation of the polymer, some chemical groups can be lost from each monomer. The piece of the monomer that is incorporated into the polymer is known as the repeating unit or monomer residue. The backbone of the polymer is the continuous link between the monomer residues. The polymer can also contain pendant functional groups connected to the backbone at various locations along the backbone. Polymer nomenclature is generally based upon the type of monomer residues comprising the polymer. A polymer formed from one type of monomer residue is called a homopolymer. A polymer formed from two or more different types of monomer residues is called a copolymer. The number of repeating units of a polymer is referred to as the chain length of the polymer. The number of repeating units of a polymer can range from approximately 11 to greater than 10,000. In a copolymer, the repeating units from each of the monomer residues can be arranged in various manners along the polymer chain. For example, the repeating units can be random, alternating, periodic, or block. The conditions of the polymerization reaction can be adjusted to help control the average number of repeating units (the average chain length) of the polymer. Polymer molecules can be cross-linked. As used herein, a "cross-link" and all grammatical variations thereof is a bond between two or more polymer molecules. Cross-linked polymer molecules can form a polymer network.

A polymer has an average molecular weight, which is directly related to the average chain length of the polymer. The average molecular weight of a polymer has an impact on some of the physical characteristics of a polymer, for example, its solubility and its dispersibility. For a copolymer, each of the monomers will be repeated a certain number of times (number of repeating units). The average molecular weight ($M_w$) for a copolymer can be expressed as follows:

$$M_w = \Sigma w_x M_x$$

where $w_x$ is the weight fraction of molecules whose weight is $M_x$.

The polymer can be a copolymer. The copolymer can be an olefin copolymer. As used herein, the expression "olefin copolymer" refers to copolymers comprising a first monomer of ethylene or propylene, polymerized with any of 1-butene, 4-methyl-1-pentene, 1-hexene, 1-octene, 1-decene, 1-dodecene, 1-tetradecene, 1-hexadecene, 1-octadecene, and 1-eicosene. In a preferred embodiment, the olefin copolymer could be comprised of ethylene and octene. Olefin copolymers may include an olefin block copolymer, olefin random copolymer, or some mixture of the two.

The molecular weight of the polymer can affect the viscosity of the fluid. According to certain embodiments, the molecular weight of the polymer is selected such that the fluid has a necessary viscosity to form a continuous fiber. The base fluid according to any of the embodiments can have a viscosity in the range of 1 to 1,000,000 cP. The concentration of the polymer can also be selected such that a continuous fiber is formed. The polymer according to any of the embodiments can be in a concentration in the range of 1 to 99.9 weight percent (wt. %) of the base fluid.

The fluid can include a base fluid. As used herein, a "fluid" is a substance having a continuous phase that can flow and conform to the outline of its container when the substance is tested at a temperature of 71° F. (22° C.) and a pressure of one atmosphere "atm" (0.1 megapascals "MPa"). A fluid can be a liquid or gas. A homogenous fluid has only one phase; whereas a heterogeneous fluid has more than one distinct phase. A colloid is an example of a heterogeneous fluid. A heterogeneous fluid can be: a slurry, which includes a continuous liquid phase and undissolved solid particles as the dispersed phase; an emulsion, which includes a continuous liquid phase and at least one dispersed phase of immiscible liquid droplets; a foam, which includes a continuous liquid phase and a gas as the dispersed phase; or a mist, which includes a continuous gas phase and liquid droplets as the dispersed phase. A heterogeneous fluid will have only one continuous phase, but can have more than one dispersed phase. It is to be understood that any of the phases of a heterogeneous fluid (e.g., a continuous or dispersed phase) can contain dissolved or undissolved substances or compounds. As used herein, the term "base fluid" means the solvent of a solution or the continuous phase of a heterogeneous fluid and is the liquid that is in the greatest percentage by volume of a fluid.

The base fluid can be the continuous phase of a heterogeneous fluid. The base fluid can solubilize the polymer. The base fluid according to any of the embodiments can be selected such that the polymer dissolves. The base fluid can be selected from the group of polar aprotic solvents, such as N,N-dimethyl formamide, tetrahydrofuran, and combinations thereof. The surface tension of the base fluid can impact the morphology of the fiber. The base fluid can be selected such that a desired surface tension is achieved. According to certain embodiments, the base fluid has a surface tension in the range of 11 to 85 mN/m at 20° C. The base fluid according to any of the embodiments can have a conductivity in the range of 5 μS/cm to 5 S/m at 20° C.

The fluid can also include a plurality of piezoelectric ceramic particles. According to certain embodiments, the piezoelectric ceramic particles do not dissolve in the base fluid. Accordingly, the fluid can be classified as a slurry in which the continuous phase comprises the base fluid and solubilized copolymer and a dispersed phase of insoluble piezoelectric ceramic particles.

The piezoelectric ceramic particles can be selected from the group consisting of lead zirconate titanate (PZT), hydroxyapatite, apatite, lithium sulfate monohydrate, sodium bismuth titanate, quartz, tartaric acid fibers, poly (vinylidene difluoride) fibers, barium titanate, lithium-doped potassium sodium niobate (KNLN) having the formula $(K,Na)_{1-t}Li_tNbO_3$, in which the variable 't' ranges from greater than 0.01 to less than 1 (0.01<t<1.00), potassium sodium niobate $(KNaNb)O_3$ (KNN), and combinations thereof. According to any of the embodiments, the piezo-electric ceramic particles can be in a concentration in the range of 0.01 to 99 wt. % of the base fluid. The piezoelectric ceramic particles can also have a mean particle size in the range 20 nanometers to 100 micrometers. Unlike other piezoelectric fabrics, such as PVDF that typically thermally degrades and loses functionality at temperatures at or below 60° C., it has unexpectedly been discovered that disclosed embodiments containing the polymer and piezoelectric ceramic particles have superior thermal stability. The disclosed piezoelectric fabrics can be piezo thermally stable up to 140° C.

The methods include applying a voltage to create an electric field between a tip of the needle and a collector during fluid flow. During application of the voltage, a charge accumulates at the fluid surface. When the electrostatic repulsion is higher than the surface tension of the fluid, the fluid's meniscus is deformed into a conically shaped structure known as the Taylor cone. Once the Taylor cone is formed, the charged liquid jet is ejected towards the collector. Depending on the solution viscosity, solid fibers will be formed as the solvent evaporates from the whipping motion that occurs during its flight time from the Taylor cone to the collector. The result is a non-woven fiber mat that is deposited on the collector. The applied voltage can also vary and be selected to produce a continuous fiber. The applied voltage can be in the range of 0.50 to 90 V. Additionally, the distance between the needle tip and the collector can also affect formation of a continuous fiber. The distance can be selected such that a continuous fiber is formed. The distance between the tip of the needle and the surface of the collector according to any of the embodiments can be in the range of 1 to 30 cm.

The methods can also include collecting the continuous fiber on the collector. The collector can be a variety of shapes and sizes. A greater size may be used to form a larger mat of the non-woven fibers. The collector can be selected from stationary flat plates, rotating drums, mandrels, and disks. The fiber mat produced can have a thickness ranging from millimeters to nanometers. Without being limited by theory, it is believed that a micro- or nano-fiber can improve the performance of the e-textile by providing an increased surface area as well as affect the spaces between the fibers of the mat. For example, the amount of spacing and size of the spaces may be decreased in the mat for the micro- or nano-fiber.

Figure 2:
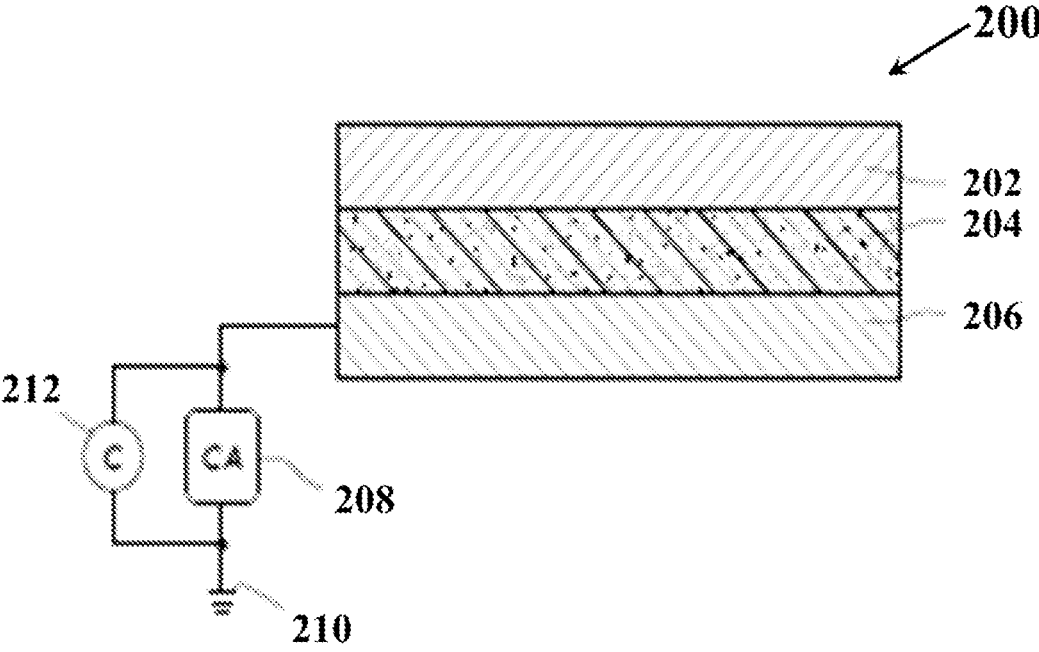
FIG. 2 is a schematic illustration of a piezoelectric sensor.

FIG. 2 is a schematic of a representative piezoelectric sensor structure 200. In piezoelectric materials, a voltage or charges are generated by a mechanical stress. A circuit is created by connecting a positive and negative terminal 208 and 212 grounded to a ground 210 to the sensor. A piezoelectric material 204 is contained between a top electrode 202 and a bottom electrode 206. Mechanical stress applied to the sensor creates the voltage or charges. This effect is reversible (i.e., a piezoelectric material will produce a mechanical action when excited by an electrical potential). It is convenient to have smart, extremely flexible fabrics that by itself can sense touch, force, vibration, flow, stretch, and strain. Fundamentally, piezoelectricity works because of asymmetric atomic arrangement in solid crystals. As pressure is applied to the crystals, charges flow through them due to this asymmetry. The charges travel to the surface of the material and are then collected by the conductive layer on either side of the piezo-layer.

Therefore, the present disclosures are well adapted to attain the ends and advantages mentioned as well as those that are inherent therein. The particular embodiments disclosed above are illustrative only, as the present disclosures may be modified and practiced in different but equivalent manners apparent to those skilled in the art having the benefit of the teachings herein. Furthermore, no limitations are intended to the details of construction or design herein shown, other than as described in the claims below. It is, therefore, evident that the particular illustrative embodiments disclosed above may be altered or modified and all such variations are considered within the scope and spirit of the present disclosures.

As used herein, the words "comprise," "have," "include," and all grammatical variations thereof are each intended to have an open, non-limiting meaning that does not exclude additional elements or steps. While compositions, systems, and methods are described in terms of "comprising," "containing," or "including" various components or steps, the compositions, systems, and methods also can "consist essentially of" or "consist of" the various components and steps. It should also be understood that, as used herein, "first," "second," and "third," are assigned arbitrarily and are merely intended to differentiate between two or more materials, steps, etc., as the case may be, and does not indicate any sequence. Furthermore, it is to be understood that the mere use of the word "first" does not require that there be any "second," and the mere use of the word "second" does not require that there be any "third," etc.

Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces. If there is any conflict in the usages of a word or term in this specification and one or more patent(s) or other documents that may be incorporated herein by reference, the definitions that are consistent with this specification should be adopted.

What is claimed is:

1. A method of producing a piezoelectric fabric comprising:

forming a continuous fiber of material comprising:

flowing a fluid through a needle, wherein the fluid comprises:

an olefin copolymer;

a base fluid, wherein the base fluid is a heterogeneous fluid comprising a continuous phase comprising a base fluid and polymer solution and an internal phase comprising dispersed piezoelectric ceramic particles; and a plurality of piezoelectric ceramic particles; and applying a voltage to create an electric field between a tip of the needle and a collector during fluid flow; and collecting the continuous fiber on the collector.

2. The method according to claim 1, wherein the piezoelectric fabric is non-woven.

3. The method according to claim 1, wherein the olefin copolymer comprises of ethylene and octene.

4. The method according to claim 1, wherein the olefin copolymer has a molecular weight in the range of 10,000 to 100,000 g/mol.

5. The method according to claim 1, wherein the olefin copolymer is in a concentration in the range of 1 to 99.9 weight percent of the base fluid.

6. The method according to claim 1, wherein the base fluid dissolves the olefin copolymer.

7. The method according to claim 1 wherein the base fluid has a surface tension in the range of 11 to 85 mN/m at 20° C.

8. The method according to claim 1, wherein the base fluid has a conductivity in the range of 5 $\mu$S/cm to 5 S/m at 20° C.

9. The method according to claim 1, wherein the piezoelectric ceramic particles are in a concentration in the range of 0.01 to 99 weight percent of the base fluid.

10. The method according to claim 1, wherein the piezoelectric ceramic particles are selected from the group consisting of lead zirconate titanate (PZT), hydroxyapatite, apatite, lithium sulfate monohydrate, sodium bismuth titanate, quartz, barium titanate, lithium-doped potassium sodium niobate (KNLN), potassium sodium niobate (KNN), and combinations thereof.

*     *     *     *     *